(12) United States Patent
Thakur

(10) Patent No.: US 8,432,200 B1
(45) Date of Patent: Apr. 30, 2013

(54) SELF-TRACKING ADAPTIVE BANDWIDTH PHASE-LOCKED LOOP

(75) Inventor: Krishna Thakur, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/343,719

(22) Filed: Jan. 5, 2012

(51) Int. Cl.
*H03L 7/06* (2006.01)
(52) U.S. Cl.
USPC .......................................... 327/156; 327/147
(58) Field of Classification Search .................... None
See application file for complete search history.

(56) References Cited

U.S. PATENT DOCUMENTS

| | | | |
|---|---|---|---|
| 5,508,660 A | 4/1996 | Gersbach et al. | |
| 5,687,201 A | 11/1997 | McClellan | |
| 5,740,213 A * | 4/1998 | Dreyer | 375/374 |
| 6,570,423 B1 * | 5/2003 | Trivedi et al. | 327/157 |
| 6,828,864 B2 | 12/2004 | Maxim | |
| 6,870,411 B2 * | 3/2005 | Shibahara et al. | 327/156 |
| 6,894,569 B2 | 5/2005 | Fayneh et al. | |
| 7,095,287 B2 | 8/2006 | Maxim | |
| 7,148,757 B2 * | 12/2006 | Chiu | 331/16 |
| 7,173,461 B2 | 2/2007 | Tan | |
| 7,176,733 B2 | 2/2007 | Haerle | |
| 7,253,686 B2 | 8/2007 | Ali | |
| 7,365,581 B2 | 4/2008 | Shi | |
| 7,391,271 B2 | 6/2008 | Cranford | |
| 7,907,022 B2 * | 3/2011 | Thakur et al. | 331/44 |
| 2003/0206042 A1 * | 11/2003 | Walker et al. | 327/156 |
| 2005/0174180 A1 | 8/2005 | Mone | |
| 2008/0218229 A1 | 9/2008 | Cranford | |
| 2009/0237132 A1 * | 9/2009 | Wang et al. | 327/157 |
| 2012/0235718 A1 * | 9/2012 | Thakur et al. | 327/157 |

OTHER PUBLICATIONS

Stefanos Sidiropoulos, Dean Liu, Jaeha Kim, Guyeon Wei, and Mark Horowitz, Adaptive Bandwidth DLLs and PLLs using Regulated Supply CMOS Buffers, Rambus Inc and Stanford University, Symposium VLSI Circuits Digest of Technical Papers, 2000.
J. Maneatis, "Low-Jitter Process-Independent DLL and PLL based on self-biased techniques," IEEE J. Solid-State Circuits, vol. 31, pp. 1723-1732, Nov. 1996.
Yu-Jen Lai et al., An Agile VCO Frequency Calibration Technique for a 10-GHz CMOS PLL, IEEE Journal of Solid State Circuits vol. 42, No. 2, Feb. 2007.

* cited by examiner

*Primary Examiner* — Tuan T Lam
(74) *Attorney, Agent, or Firm* — Charles Bergere

(57) ABSTRACT

A phase-locked loop (PLL) generates an oscillator signal based on an input reference signal. A voltage-to-current converter converts a control voltage to a first current and a current-controlled oscillator generates the oscillator signal based on the first current. A dual charge pump circuit generates first and second charge pump currents having a predetermined ratio based on fractions of the calibration current and the first current and an error (feedback) signal. An active loop filter generates the control voltage based on the first and second charge pump currents and includes a transconductance stage having a transconductance that varies with the variation in a third current. The variation in the transconductance causes the second charge pump current to vary, which in turn adjusts the predetermined ratio between the first and second charge pump currents.

18 Claims, 2 Drawing Sheets

SELF-TRACKING ADAPTIVE BANDWIDTH PHASE-LOCKED LOOP

BACKGROUND OF THE INVENTION

The present invention relates generally to a system for generating an oscillator signal and, more particularly, to a phase-locked loop (PLL) for generating an oscillator signal.

A phase-locked loop (PLL) generates an oscillator signal having a constant phase relationship with an input reference signal. PLLs are widely used in various applications such as radio, telecommunications, computers, and other electronic applications. A PLL includes a voltage-controlled oscillator (VCO) for generating the oscillator signal based on a control voltage, and a phase detector for comparing the phase of the oscillator signal with that of the input reference signal and for generating an error signal based on the detected phase difference. The PLL also includes a loop filter for filtering the error signal and generating the control voltage used by the VCO. External calibration circuits may be used for calibrating the VCO.

Generally, PLL systems are expected to operate over a wide range of frequencies and over a wide range of process, voltage and temperature (PVT) variations. For stable operation, the bandwidth of the PLL is required to be dependent only on the frequency of the input reference signal. However, the bandwidth may vary with various other parameters, such as process, voltage and temperature (PVT) variations, loop division factor 'N', PLL design parameters and the like. These parameters introduce undesired variance into the PLL bandwidth and degrade the loop stability of the PLL. To stabilize the bandwidth, input reference signal frequency may be tracked using a dual charge pump circuit in PLLs. A detailed description of one such above mentioned PLL system has been provided below in conjunction with FIG. 1.

Referring now to FIG. 1, a schematic diagram illustrating a conventional PLL 100 is shown. The PLL 100 includes a VCO 102, a frequency divider 104, a phase detector 106, a dual charge pump circuit 108, an active loop filter 110, a calibration circuit 112 and a reference current generation circuit 114. The VCO 102 generates an oscillator signal based on a control voltage. The phase detector 106 is connected to the VCO 102 by way of the frequency divider 104 and compares the phase of the oscillator signal with that of an input reference signal ($f_{ref}$) and generates an error signal based on the detected phase difference. The frequency divider 104, which is connected between the VCO 102 and the phase detector 106, provides a fraction of the oscillator signal to the phase detector 106. The dual charge pump circuit 108 is connected to the phase detector 106 and the VCO 102. The dual charge pump circuit 108 receives the VCO current from the VCO 102 and generates two charge pump currents using the error signal and according to a predetermined ratio. The active loop filter 110, which is connected between the dual charge pump circuit 108 and the VCO 102, receives the two charge pump currents and generates the control voltage, which is then provided to the VCO 102. A fraction of a reference current generated by the reference current generation circuit 114 is provided to a transconductance stage (not shown) within the active loop filter 110 as a bias current. The bias current is used to bias the transistors within the transconductance stage.

The calibration circuit 112 is connected to the VCO 102 and coarse tunes the VCO 102 close to a locking frequency, while keeping the PLL 100 in an open loop. Thereafter, the VCO 102 is fine tuned to the locking frequency by closing the loop. The predetermined ratio between the two charge pump currents is adjusted to optimize the bandwidth of the PLL 100 and the bandwidth is made directly proportional to the input reference frequency.

The conventional PLL 100 is a self-biased PLL and the bandwidth of such a self-biased PLL remains stable. However, the loop dynamics of a self-biased PLL may be affected by unwanted changes in the DC gain and the zero location of the PLL. Such unwanted changes are introduced due to a change in transconductance by the transconductance stage. For example, the transconductance may change with a change in the value of a poly-resistor used in reference current generation circuit 114. The value of the poly-resistor may vary with the change in the process and temperature variations. The bias current generated by the reference current generation circuit 114 depends on the value of the poly-resistor and thus any variation in the poly-resistor value causes a fluctuation in the bias current that translates into variations in the transconductance at the transconductance stage. The DC gain and the zero location of a self-biased PLL are proportional to the transconductance and vary with the variations in the transconductance and further degrade the loop dynamics of the self-biased PLL.

It would be advantageous to have a PLL that compensates for variations in the DC gain and zero location. It also would be advantageous to have a PLL with improved loop dynamics.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
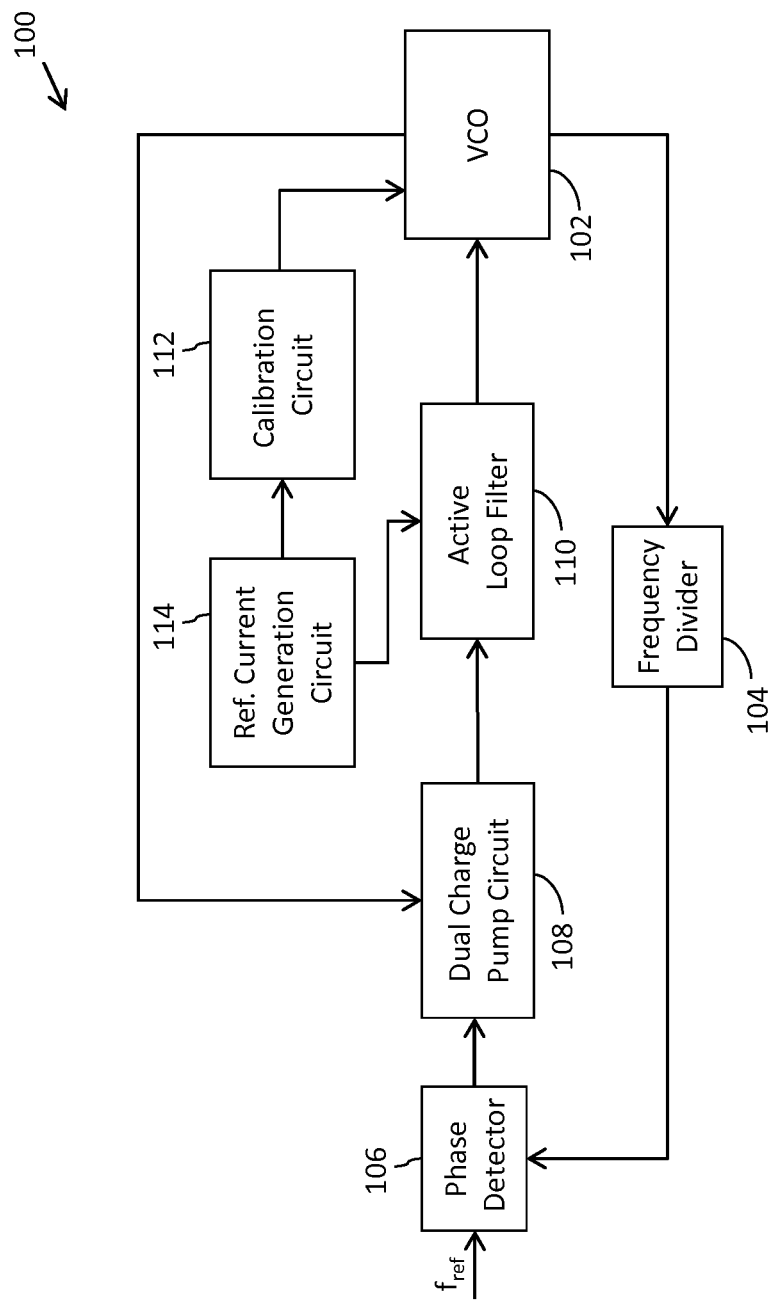
FIG. 1 is a schematic block diagram illustrating a conventional phase-locked loop (PLL)

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a phase-locked loop (PLL) is provided that includes a calibration circuit that generates a calibration current and a voltage-controlled oscillator (VCO). The VCO includes a voltage-to-current converter and a current-controlled oscillator (CCO). The CCO is connected to the voltage-to-current converter and the calibration circuit. The voltage-to-current converter converts a control voltage to a first current. The CCO generates an oscillator signal based on at least one of the first current and the calibration current. A phase detector is connected to the VCO for generating an error signal based on an input reference signal and a fraction of the oscillator signal. A current adder circuit is connected to the voltage-to-current converter and the calibration circuit. The current adder circuit sums a fraction of the first current and a fraction of the calibration current to generate a second current. A reference current generation circuit is connected to the calibration circuit for generating a third current. A dual charge pump circuit is connected to the phase detector and the current adder circuit. The dual charge pump circuit receives the error signal and the second current and generates first and second charge pump currents according to a predetermined ratio. The second charge pump current is generated by summing a fraction of the second current and a fraction of the third current. An active loop filter is connected to the dual charge pump circuit, the reference current generation circuit and the voltage-to-current converter, and generates the control voltage based on the first and second charge pump currents. The active loop filter includes an input capacitance that varies with variation in the predetermined ratio of the first and second charge pump currents. The active loop filter also includes a transconductance stage having a transconductance that varies based on the third current.

In another embodiment of the present invention, a system for generating an oscillator signal is provided. The system includes a calibration circuit for generating a calibration current and a voltage-to-current converter that converts a control voltage to a first current. A current-controlled oscillator (CCO) is connected to the voltage-to-current converter and the calibration circuit. The CCO generates an oscillator signal based on at least one of the first current and the calibration current. A phase detector is connected to the CCO for generating an error signal based on an input reference signal and a fraction of the oscillator signal. A current adder circuit is connected to the voltage-to-current converter and the calibration circuit. The current adder circuit sums a fraction of the first current and a fraction of the calibration current to generate a second current. A reference current generation circuit is connected to the calibration circuit for generating a third current. A dual charge pump circuit is connected to the phase detector and the current adder circuit. The dual charge pump circuit receives the error signal and the second current and generates first and second charge pump currents according to a predetermined ratio. The second charge pump current is generated by summing a fraction of the second current and a fraction of the third current. An active loop filter is connected to the dual charge pump circuit, the reference current generation circuit and the voltage-to-current converter, and generates the control voltage based on the first and second charge pump currents. The active loop filter includes an input capacitance that varies with variation in the predetermined ratio of the first and second charge pump currents. The active loop filter also includes a transconductance stage having a transconductance that varies based on the third current.

Embodiments of the present invention provide a phase-locked loop (PLL) for generating an oscillator signal. The PLL includes a dual charge pump circuit for generating first and second charge pump currents according to a predetermined ratio. The second charge pump current is generated by summing fractions of the calibration and VCO currents and a fraction of a third current (or bias current) generated by the reference current generation circuit. Any unwanted variation in the bias current results in a change in the transconductance that translates into a change in the second charge pump current. A change in the second charge pump current adjusts the predetermined ratio between the first and the second charge pump currents and compensates the change in the transconductance caused by the change in the bias current. Thus, the DC gain and the zero location of the PLL, which are proportional to the transconductance, are stabilized and the loop dynamics of the PLL is improved.

Many of the elements of the charge pump circuit of the present invention, described in detail below, are generally known and therefore, only as much description as necessary to teach one of skill in the art to make and use the invention is provided so as not to obfuscate the invention.

Figure 2:
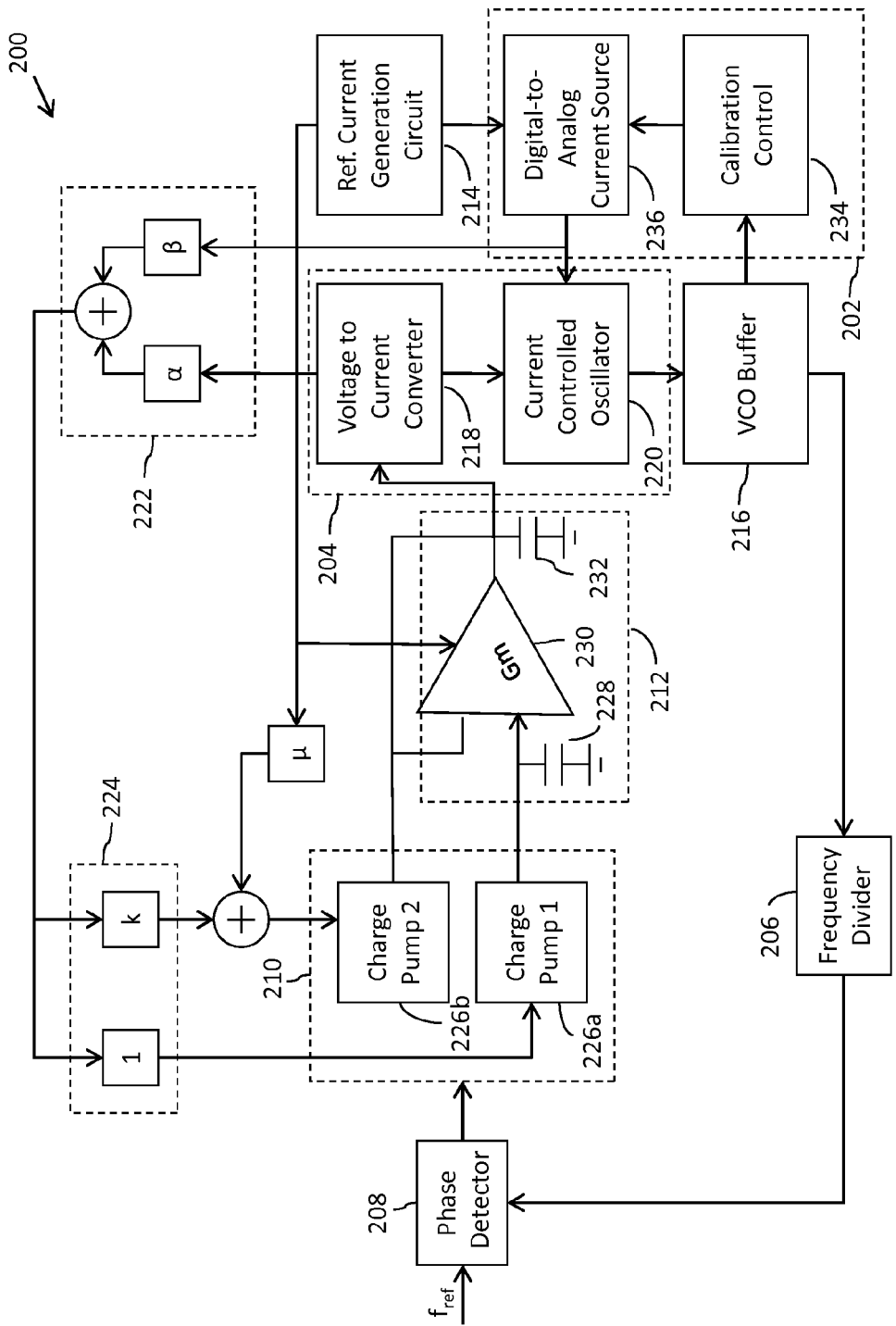
FIG. 2 is a schematic block diagram illustrating a PLL, in accordance with an embodiment of the present invention.

Referring now to FIG. 2, a schematic block diagram of a phase-locked loop (PLL) 200 in accordance with an embodiment of the present invention is shown. The PLL 200 includes a calibration circuit 202, a voltage-controlled oscillator (VCO) 204, a frequency divider 206, a phase detector 208, a dual charge pump circuit 210, an active loop filter 212, a reference current generation circuit 214, and a VCO buffer circuit 216. The VCO 204 includes a voltage-to-current converter 218 and a current-controlled oscillator (CCO) 220.

The calibration circuit 202 is connected to the VCO 204 and the reference current generation circuit 214, and using a current (referred to later as "third current") generated by the reference current generation circuit 214, generates a calibration current that is provided to the VCO 204. The voltage-to-current converter 218 converts a control voltage ($V_{ctl}$) to a first current. The CCO 220, which is connected to the voltage-to-current converter 218 and the calibration circuit 202, generates an oscillator signal based on the first current and the calibration current. The frequency divider 206 is connected between the CCO 220 and the phase detector 208 and provides a fraction of the oscillator signal to the phase detector 208. The phase detector 208 generates an error signal based on an input reference signal ($f_{ref}$) and the fraction of the oscillator signal.

A current adder circuit 222 is connected to the voltage-to-current converter 218 and the calibration circuit 202. The current adder circuit 222 sums a fraction of the first current and a fraction of the calibration current to generate a second current. More specifically, the current adder circuit 222 scales the first current by a factor '$\alpha$' and the calibration current by a factor '$\beta$' and sums the scaled currents to generate the second current. The values of '$\alpha$' and '$\beta$' may be chosen according to the design requirements of the PLL 200 and may be obtained by simulating stability analysis of the PLL 200 by using any suitable commercially available simulation tool, such as the MATLAB® tool developed by Mathworks®. For example, the value of '$\alpha$' may be in the range of 1/25 to 1/35 and the value of '$\beta$' may be in the range of 1/60 to 1/80.

The dual charge pump circuit 210 is connected to the phase detector 208, the current adder circuit 222 and the reference current generation circuit 214. The dual charge pump circuit 210 receives the error signal from the phase detector 208 and the second current from the current adder circuit 222 and generates a first charge pump current ($I_{CP1}$) and a second charge pump current ($I_{CP2}$) according to a predetermined ratio. As shown in the drawing, in one embodiment the dual charge pump circuit 210 includes a first charge pump 226a and a second charge pump 226b for generating the two charge pump currents $I_{CP1}$ and $I_{CP2}$ respectively. $I_{CP2}$ is generated by summing a fraction of the second current and a fraction of a third current (also known as bias current) generated by the reference current generation circuit 214. In an embodiment of the present invention, the third current is scaled by a factor '$\mu$' and summed with the fraction of the second current to generate $I_{CP2}$. The value of '$\mu$' may be in the range of 1 to 1.2 and is chosen according to the design requirements of the PLL 200 and may be obtained by simulating stability analysis of the PLL 200 by using any suitable commercially available simulation tool, such as the MATLAB® tool developed by Mathworks®.

In one embodiment of the invention, a current programming circuit 224 is used to program or set the ratio between $I_{CP1}$ and $I_{CP2}$. The current programming circuit 224 is integrated with (is part of) the dual charge pump circuit 210. The current programming circuit 224 receives the second current and divides it according to a predetermined ration 1:k. The value of 'k' may be chosen based on the design requirements of the PLL 200. For example, if the value of 'k' is chosen as 2, $I_{CP1}$ and $I_{CP2}$ are divided in the ratio 1:2.

The active loop filter 212, which may be a low pass filter, is connected between the dual charge pump circuit 210, the reference current generation circuit 214 and the voltage-to-current converter 218. The active loop filter 212 generates the control voltage ($V_{ctrl}$) based on the first and second charge pump currents $I_{CP1}$ and $I_{CP2}$. The active loop filter 212 includes an input capacitor 228, a transconductance stage 230 and an output capacitor 232. The input capacitor 228 is connected between the signal line that provides the first charge pump current ($I_{CP1}$) to the transconductance stage 230 and ground, and the output capacitor 232 is connected between the signal line that provides the second charge pump current ($I_{CP2}$) to the transconductance stage 230 and ground.

The capacitance value of the input capacitor 228 varies with the variation in the predetermined ratio between $I_{CP1}$ and $I^{CP2}$. The capacitance value is multiplied by the ratio between $I_{CP1}$ and $I_{CP2}$, which increases the effective capacitance of the input capacitor 228. The ratio between $I_{CP1}$ and $I_{CP2}$ may be set depending upon the capacitance value required for operating the PLL. For example, if the ratio $I_{CP1}:I_{CP2}$ is equal to 1:2 and the capacitance value of the input capacitor 228 is chosen to be 100 picofarad (pf), the effective capacitance of the input capacitor 228 equals 200 pf. The transconductance stage 230 is biased by the bias current provided by the reference current generation circuit 214 and the transconductance value varies with the variation in the bias current. The variation in the bias current causes $I_{CP2}$ to vary, which in turn (along with the current programming circuit 224) adjusts the ratio $I_{CP1}:I_{CP2}$.

In operation, initially, the PLL 200 is kept in an open loop. The voltage-to-current converter 218 generates the first current based on the control voltage ($V_{ct1}$). The calibration circuit 202 generates the calibration current, which is used for coarse tuning the CCO 220 close to a locking frequency. The locking frequency represents the frequency of the oscillator signal to be generated. In one embodiment of the invention, the calibration circuit 202 includes a calibration control circuit 234 and a digital-to-analog converter (DAC) current source 236. The DAC current source 236 is connected to the reference current generation circuit 214. The DAC current source 236 receives a digital current signal from the reference current generation circuit 214 and converts it to an equivalent analog calibration current. The DAC current source 236 is controlled by the calibration control circuit 234. In various embodiments of the present invention, the calibration control circuit 234 and the DAC source 236 may comprise either analog or digital circuitry, or a combination thereof. The first current and the calibration current are summed and provided to the CCO 220, and the CCO 220 generates the oscillator signal based on the sum of the first current and the calibration current.

The VCO buffer circuit 216 is connected to the calibration circuit 202, the frequency divider 206, and the CCO 220. The VCO buffer circuit 216 receives the oscillator signal from the current-controlled oscillator 220 and generates an equivalent rail-to-rail voltage. The calibration control circuit 234 receives the rail-to-rail voltage from the VCO buffer circuit 216 and generates a control signal for controlling the calibration current generated by the DAC current source 234. The calibration circuit 202 provides the calibration current to the CCO 220 until it is coarse tuned close to the locking frequency.

After coarse tuning, the PLL 200 is closed and the CCO 220 is fine-tuned to the locking frequency. The frequency divider 206 divides the oscillator signal by a loop division factor 'N' and provides a fraction of the oscillator signal to the phase detector 208. The phase detector 208 also receives the input reference signal $f_{ref}$. In an embodiment of the present invention, the frequency of the input reference signal is '1/N' times the locking frequency. The phase detector 208 compares the phase and frequency of the fraction of the oscillator signal and the input reference signal $f_{ref}$ to generate the error signal. In an embodiment of the present invention, the error signal is in the form of a pulse having up and down transitions that represent the phase/frequency error between the input reference signal $f_{ref}$ and the fraction of the oscillator signal. As shown in FIG. 2, the error signal is provided to the dual charge pump circuit 210.

The current adder circuit 222 scales the first current by a factor 'α' and the calibration current by a factor 'β' and sums the scaled currents to generate the second current. The dual charge pump circuit 210 generates the charge pump currents $I_{CP1}$ and $I_{CP2}$ based on the error signal and the second current. A third current (bias current) generated by the reference current generation circuit 214 is scaled by a factor 'μ' and summed with the fraction of the second current to generate $I_{CP2}$.

In an embodiment of the present invention, the dual charge pump circuit 210 is responsive to the up and down transitions of the error signal. Based on the up and down transitions, the dual charge pump circuit 210 provides the charge pump currents $I_{CP1}$ and $I_{CP2}$ to the active loop filter 212. The active loop filter 212 receives the charge pump currents $I_{CP1}$ and $I_{CP2}$ and generates an equivalent control voltage ($V_{ctrl}$), which is input to the voltage-to-current converter 218.

The effective capacitance value of the input capacitor 228 is varied based on the predetermined ratio of $I_{CP1}$ and $I_{CP2}$. Further, any unwanted variations in the third current due to process variations on the poly-resistor of the reference current generation circuit 214 causes the third current (bias current) to change, which results in a change in $I_{CP2}$. A change in $I_{CP2}$ adjusts the predetermined ratio $I_{CP1}:I_{CP2}$ and compensates for the change in the transconductance caused by the change in the third current (bias current). Thus, the DC gain and the zero location of the PLL 200, which are proportional to the transconductance, are stabilized and the loop dynamics of the PLL 200 are improved.

The DC gain of the PLL 200 is given by the following equation (1), $$\text{DC gain } \alpha (K_{pfd-cp} * K_{VCO} * R_{lpf})/N, \text{ where} \quad (1)$$

$K_{pfd-cp}$=gain of the phase detector 208 and the dual charge pump circuit 210,
$K_{VCO}$=gain of the VCO 204,
$R_{lpf}$=resistance of the transconductance stage 230, and
N=Loop Division Factor
Further the zero location ($s_z$) is given by, $$s_z = 1/(R_{lpf} * C_{lpf}), \text{ where} \quad (2)$$

$C_{lpf}$=effective capacitance of the active loop filter 212

$$K_{pfd-cp} \alpha I_{CP} \text{ where,} \quad (3)$$

$$I_{CP} = I_{CP2} \quad (4)$$

$$K_{VCO} = K_{v2I} * K_{CCO} \text{ where,}$$

$K_{v2I}$=gain of the voltage-to-current converter 218,
$K_{CCO}$=gain of the CCO 220
The ratio (K) for $I_{CP1}:I_{CP1}$ is given by, $$K = I_{CP2}/I_{CP1} \quad (5)$$

$$R_{lpf} = 1/G_m \text{ where,} \quad (6)$$

$G_m$=transconductance of the transconductance stage 230

Also, $$I_{CP} \alpha I_{VCO} \alpha f_{VCO} \alpha f_{ref}, \text{ where}$$

$I_{VCO}$=VCO current (first current),
$f_{VCO}$=frequency of the oscillator signal, and
$f_{ref}$=frequency of the input reference signal Substituting equations (3), (4), (5), and (6) in equations (1) and (2) provides, $$\text{DC gain } \alpha (I_{CP1} * K_{VCO} * (1/G_m) * K)/N \quad (7),$$

and, $$s_z = G_m/(K * C_{lpf}) \quad (8)$$

As the PLL 200 is a self-biased PLL, $$(I_{CP1} * K_{VCO})/N \sim \text{constant}$$

Hence, the requirement is to counter the variation of $G_m$ and stabilize the loop dynamics of the PLL 200. Mathematically, $$I_{CP2} = (\mu) * I_{gm} + K * I_{CP1}, \text{ where} \quad (9)$$

$I_{gm}$=bias current of the transconductance stage 230 and is derived from the reference current generation circuit 214.

Dividing the equation (9) by $I_{CP1}$, $$I_{CP2}/I_{CP1} = K = ((\mu) * I_{gm})/I_{CP1} + K = K_{new},$$

As $I_{CP2}$ is independent of the changes in poly-resistor values of the reference current generation circuit 214, and $I_{gm}$ is inversely proportional to the resistance, $K_{new}$ becomes a dynamic parameter that tracks $(1/G_m)$. Hence substituting the new value of K in equations (7) and (8), $$\text{DC gain } \alpha (I_{CP1} * K_{VCO} * (1/G_m) * K_{new})/N, \text{ or}$$

$$\text{DC gain } \alpha (I_{CP1} * K_{VCO} * (1/G_m) * ((\mu) * I_{gm})/I_{CP1} + K)/N$$

and, $$s_z = G_m/(K_{new} * C_{lpf})$$

Thus, the DC gain and the zero location of the PLL 200 remain stable over the changes in the bias current and improve the loop dynamics of the PLL 200.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A phase-locked loop (PLL), comprising:
a calibration circuit for generating a calibration current;
a voltage-controlled oscillator (VCO), including:
  a voltage-to-current converter for converting a control voltage to a first current; and
  a current-controlled oscillator, connected to the voltage-to-current converter and the calibration circuit, for generating an oscillator signal based on at least one of the first current and the calibration current;
a phase detector, connected to the VCO, for generating an error signal based on an input reference signal and a fraction of the oscillator signal;
a current adder circuit, connected to the voltage-to-current converter and the calibration circuit, for summing a fraction of the first current and a fraction of the calibration current to generate a second current;
a reference current generation circuit, connected to the calibration circuit, for generating a third current;
a dual charge pump circuit, including a first charge pump and a second charge pump, connected to the phase detector and the current adder circuit, for receiving the error signal and the second current, and generating first and second charge pump currents having a predetermined ratio, wherein the second charge pump current is generated by summing a fraction of the second current and a fraction of the third current; and
an active loop filter connected to the dual charge pump circuit, the reference current generation circuit and the voltage-to-current converter, wherein the active loop filter generates the control voltage based on the first and second charge pump currents, and wherein the active loop filter includes:
  an input capacitance that varies with variation in the predetermined ratio of the first and second charge pump currents; and
  a transconductance stage having a transconductance that varies based on the third current.

2. The PLL of claim 1, wherein the calibration circuit includes a digital-to-analog current source, connected to the current-controlled oscillator and the reference current generation circuit, for receiving the third current from the reference current generation circuit and generating the calibration current.

3. The PLL of claim 1, further comprising a frequency divider, connected between the current-controlled oscillator and the phase detector, for providing the fraction of the oscillator signal to the phase detector.

4. The PLL of claim 3, further comprising a buffer circuit, connected to the current-controlled oscillator, the calibration circuit and the frequency divider, for converting the oscillator signal to a rail-to-rail voltage and providing the rail-to-rail voltage to the calibration circuit.

5. The PLL of claim 1, wherein the predetermined ratio varies with the variation in the third current.

6. The PLL of claim 1, further comprising a current programming circuit, connected between the current adder circuit and the dual charge pump circuit, for varying the predetermined ratio between the first and second charge pump currents.

7. The PLL of claim 6, wherein the current programming circuit varies a value of the second current.

8. The PLL of claim 1, wherein the active loop filter is an active low pass filter.

9. The PLL of claim 1, wherein current adder circuit scales the first current by a factor $\alpha$ and scales the calibration current by a factor $\beta$ and sums the scaled currents to generate the second current.

10. The PLL of claim 1, wherein the third current is scaled by a factor $\mu$ and the scaled third current is summed with the second current before being provided to the second charge pump.

11. A system for generating an oscillator signal, the system comprising:
a calibration circuit for generating a calibration current;
a voltage-to-current converter for converting a control voltage to a first current;
a current-controlled oscillator, connected to the voltage-to-current converter and the calibration circuit, for generating an oscillator signal based on at least one of the first current and the calibration current;

a phase detector, connected to the current-controlled oscillator, for generating an error signal based on an input reference signal and a fraction of the oscillator signal;

a current adder circuit, connected to the voltage-to-current converter and the calibration circuit, for summing a fraction of the first current and a fraction of the calibration current to generate a second current;

a reference current generation circuit, connected to the calibration circuit, for generating a third current;

a dual charge pump circuit including first and second charge pumps, connected to the phase detector and the current adder circuit, for receiving the error signal and the second current, and generating first and second charge pump currents having a predetermined ratio, wherein the second charge pump current is generated by summing a fraction of the second current and a fraction of the third current; and an active loop filter connected to the dual charge pump circuit, the reference current generation circuit and the voltage-to-current converter, wherein the active loop filter generates the control voltage based on the first and second charge pump currents, and wherein the active loop filter includes:

an input capacitance that varies with variation in the predetermined ratio of the first and second charge pump currents; and a transconductance stage having a transconductance that varies based on the third current.

12. The system for generating an oscillator signal of claim 11, wherein the calibration circuit includes a digital-to-analog current source, connected to the current-controlled oscillator and the reference current generation circuit, for receiving the third current from the reference current generation circuit and generating and providing the calibration current to the current-controlled oscillator.

13. The system for generating an oscillator signal of claim 11, further comprising a frequency divider, connected between the current-controlled oscillator and the phase detector, for generating and providing the fraction of the oscillator signal to the phase detector.

14. The system for generating an oscillator signal of claim 13, further comprising a buffer circuit, connected to the current-controlled oscillator, the calibration circuit and the frequency divider, for converting the oscillator signal to a rail-to-rail voltage and providing the rail-to-rail voltage to the calibration circuit.

15. The system for generating an oscillator signal of claim 11, further comprising a current programming circuit, connected between the current adder circuit and the dual charge pump circuit, wherein the current programming circuit receives the second current from the current adder circuit and generates a first scaled current that is provided to the first charge pump and a second scaled current that is combined with the third current and provided to the second charge pump, whereby the current programming circuit varies the predetermined ratio between the first and second charge pump currents.

16. The system for generating an oscillator signal of claim 15, wherein the third current is scaled by a factor of $\mu$ before being combined with the second scaled current and provide to the second charge pump.

17. The system for generating an oscillator signal of claim 11, wherein active loop filter includes an input capacitor connected between an output of the first charge pump and ground, for generating the input capacitance, and an output capacitor connected between an output of the transconductance stage and ground.

18. The system for generating an oscillator signal of claim 11, wherein current adder circuit scales the first current by a factor $\alpha$ and scales the calibration current by a factor $\beta$ and sums the scaled currents to generate the second current.

* * * * *